(12) United States Patent
Mihara

(10) Patent No.: US 9,899,540 B2
(45) Date of Patent: Feb. 20, 2018

(54) SEMICONDUCTOR DEVICE AND METHOD FOR MANUFACTURING SAME

(71) Applicant: Renesas Electronics Corporation, Koutou-ku, Tokyo (JP)

(72) Inventor: Tatsuyoshi Mihara, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/648,431

(22) Filed: Jul. 12, 2017

(65) Prior Publication Data
US 2017/0309755 A1 Oct. 26, 2017

Related U.S. Application Data

(62) Division of application No. 15/378,352, filed on Dec. 14, 2016, now Pat. No. 9,741,869.

(30) Foreign Application Priority Data

Feb. 24, 2016 (JP) ................................ 2016-032688

(51) Int. Cl.
| | | |
|---|---|---|
| *H01L 29/792* | (2006.01) | |
| *H01L 21/28* | (2006.01) | |
| *H01L 29/66* | (2006.01) | |
| *H01L 29/06* | (2006.01) | |
| *H01L 29/78* | (2006.01) | |

(52) U.S. Cl.
CPC ...... *H01L 29/792* (2013.01); *H01L 21/28282* (2013.01); *H01L 29/0653* (2013.01); *H01L 29/66795* (2013.01); *H01L 29/66833* (2013.01); *H01L 29/7851* (2013.01)

(58) Field of Classification Search
CPC ............. H01L 29/792; H01L 21/28282; H01L 29/66833; H01L 29/66795; H01L 29/0653; H01L 29/7851
See application file for complete search history.

(56) References Cited

U.S. PATENT DOCUMENTS

| | | |
|---|---|---|
| 7,504,689 B2 | 3/2009 | Hisamoto et al. |
| 2006/0001058 A1* | 1/2006 | Dreeskornfeld .. H01L 21/28282 257/288 |

(Continued)

FOREIGN PATENT DOCUMENTS

JP 2006-041354 A 2/2006

*Primary Examiner* — Walter H Swanson
(74) *Attorney, Agent, or Firm* — Shapiro, Gabor and Rosenberger, PLLC

(57) ABSTRACT

A semiconductor device includes a semiconductor substrate including a main surface, an element separation film formed over the main surface, and a fin protruding from the element separation film and extending in the first direction in plan view. The semiconductor device further includes a control gate electrode extending in the second direction that is orthogonal to the first direction along the surface of the fin through a gate insulating film and overlaps with a first main surface of the element separation film, and a memory gate electrode extending in the second direction along the surface of the fin through an insulating film and overlaps with a second main surface of the element separation film, in which the second main surface is lower than the first main surface relative to the main surface.

7 Claims, 17 Drawing Sheets

(56) References Cited

U.S. PATENT DOCUMENTS

2006/0044873 A1\* 3/2006 Katayama .......... G11C 16/0466
365/185.18
2013/0037877 A1 2/2013 Tan et al.
2013/0175504 A1\* 7/2013 Levy .................. G11C 16/0466
257/29

\* cited by examiner

SEMICONDUCTOR DEVICE AND METHOD FOR MANUFACTURING SAME

CROSS-REFERENCE TO RELATED APPLICATIONS

The disclosure of Japanese Patent Application No. 2016-032688 filed on Feb. 24, 2016 including the specification, drawings and abstract is incorporated herein by reference in its entirety.

BACKGROUND

The present invention relates to a semiconductor device and a method for manufacturing the same, and can be suitably utilized for a semiconductor device including a nonvolatile memory for example.

As an electrically writable and erasable nonvolatile memory, an EEPROM (Electrically Erasable and Programmable Read Only Memory) has been widely used. These storage devices represented by a flash memory widely used at present includes, below a gate electrode of a MISFET, an electro-conductive floating gate electrode or a trapping insulating film surrounded by an oxide film, and the electric charge accumulation state in the floating gate or the trapping insulating film is made memory information which is read out as a threshold of the transistor. This trapping insulating film means an insulating film capable of accumulating the electric charge, and a silicon nitride film and the like can be cited as an example. By injection/discharging of an electric charge to/from such electric charge accumulation region, the threshold of the MISFET is shifted, and the MISFET is operated as a storage element. As this flash memory, there is a sprit gate type cell using a MONOS (Metal-Oxide-Nitride-Oxide-Semiconductor) film. In such memory, by using a silicon nitride film as the electric charge accumulation region, compared to an electro-conductive floating gate film, there are advantages of excellence in the reliability of data retention because the electric charge is discretely accumulated, capability of making the oxide film over and below the silicon nitride film a thin film and capability of lowering the voltage of the writing/erasing operation because of excellence in the reliability of data retention, and so on.

Also, the sprit gate type memory cell includes a control gate electrode (selective gate electrode) formed over the semiconductor substrate through the first gate insulating film, and a memory gate electrode formed over the semiconductor substrate through the second gate insulating film including the electric charge accumulation region. Further, the sprit gate type memory cell includes a pair of semiconductor regions (a source region and a drain region) formed over the surface of the semiconductor substrate so as to sandwich the control gate electrode and the memory gate electrode, and the second gate insulating film has a structure called an ONO film that is a laminated structure of a silicon oxide film, a silicon nitride film, and a silicon oxide film.

Also, in Japanese Unexamined Patent Application Publication 2006-41354, a sprit gate type memory cell is disclosed in which an active region of a projected shape is formed over the surface of the semiconductor substrate, and a selective gate (control gate electrode) and a memory gate (memory gate electrode) are disposed so as to straddle the active region of the projected shape. Further, the selective gate 500 is formed over the active region through the gate insulating film 900, and the memory gate 550 is formed over the active region through the gate insulating film 950 that is formed of the ONO film. The ONO film has a laminated structure of a thermal oxidation silicon film, a silicon nitride film formed by the CVD method, and a silicon oxide film formed by the CVD method or the ISSG method, and has the electric charge retention function.

SUMMARY

The inventors of the present application have been studying a fin type nonvolatile memory cell having a structure similar to that of Japanese Unexamined Patent Application Publication 2006-41354, and the memory cell includes a control gate electrode and a memory gate electrode disposed so as to straddle an active region (called "fin" and "projected section") of a projected shape formed over the surface of the semiconductor substrate. The periphery of the fin that protrudes from the surface of the semiconductor substrate is covered with an element separation film that is formed over the surface of the semiconductor substrate, and the fin protrudes from the element separation film. The fin is a protruded part of a rectangular parallelepiped, has the width in the second direction (Y direction described below) of the main surface of the semiconductor substrate, extends in the first direction (X direction described below) that is orthogonal to the second direction, and has the main surface (upper surface) and the side surfaces. The control gate electrode extends in the first direction, is formed along the main surface and the side surfaces of the fin through the first gate insulating film, and extends over the element separation film around the fin. Also, the memory gate electrode is disposed so as to be adjacent to the control gate electrode in the first direction, and extends in the second direction. The memory gate electrode is formed along the main surface and the side surfaces of the fin through the second gate insulating film, and extends over the element separation film around the fin. Further, the second gate insulating film is formed of the ONO film described above, and a layer of a part within the second gate insulating film of a layered structure (a silicon nitride film and a silicon oxide film of the upper layer thereof) is imposed also between the element separation film and the memory gate electrode. Also, a pair of semiconductor regions (a source region and a drain region) are formed within the fin so as to sandwich the control gate electrode and the memory gate electrode. In other words, it can be said also that the nonvolatile memory cell is formed of a control transistor and a memory transistor which are coupled in series.

According to the study of the inventors of the present application, it was found out that, in the memory transistor, there was a problem that desired reading characteristics and writing characteristics could not be obtained because an ON-current matching the height of the fin could not be secured. For example, when the initial height of the fin which forms the control transistor and the memory transistor is made 40 nm, in the control transistor, because the film thickness of the first gate insulating film is approximately 2 nm for example, the height of the fin contributing to the ON-current of the control transistor is approximately 38 nm, and is generally equal to the initial height of the fin. On the other hand, in the case of the memory transistor, because the total film thickness of the ONO film that is the second gate insulating film is approximately 20 nm, and the height of the fin contributing to the ON-current of the memory transistor is approximately 20 nm which becomes approximately ½ of the initial height of the fin. For example, in the control transistor, by forming the first gate insulating film by a thermal oxidation method, the height of the fin reduces. In the memory transistor, first, because a part of the second gate insulating film is formed by thermal oxidation of the surface of the fin, the height of the fin reduces. Also, because the silicon nitride film and the silicon oxide film thereover are imposed between the element separation film and the memory gate electrode as described above, the range where the memory gate electrode and the fin overlap reduces. Therefore, in the memory transistor, the height of the fin contributing to the ON-current substantially reduces with respect to the initial height. That is to say, in the memory transistor, sufficient ON-current matching the initial height of the fin cannot be secured, and the reading characteristics and the writing characteristics deteriorate.

In other words, in the semiconductor device including the fin type nonvolatile memory, further improvement of the characteristics has been desired.

Other problems and new features will be clarified from the description of the present specification and the attached drawings.

According to an embodiment, a semiconductor device includes a semiconductor substrate that includes a first main surface, an element separation film that is formed over the first main surface, and a projected section that is a part of the semiconductor substrate, protrudes from the element separation film, and extends in the first direction in plan view. The semiconductor device further includes a control gate electrode that extends in the second direction that is orthogonal to the first direction along the surface of the projected section through a first insulating film and overlaps with a second main surface of the element separation film, and a memory gate electrode that extends in the second direction along the surface of the projected section through a second insulating film and overlaps with a third main surface of the element separation film, in which the third main surface is lower than the second main surface relative to the first main surface.

According to an embodiment, the performance of the semiconductor device can be improved.

DETAILED DESCRIPTION

Figure 1:
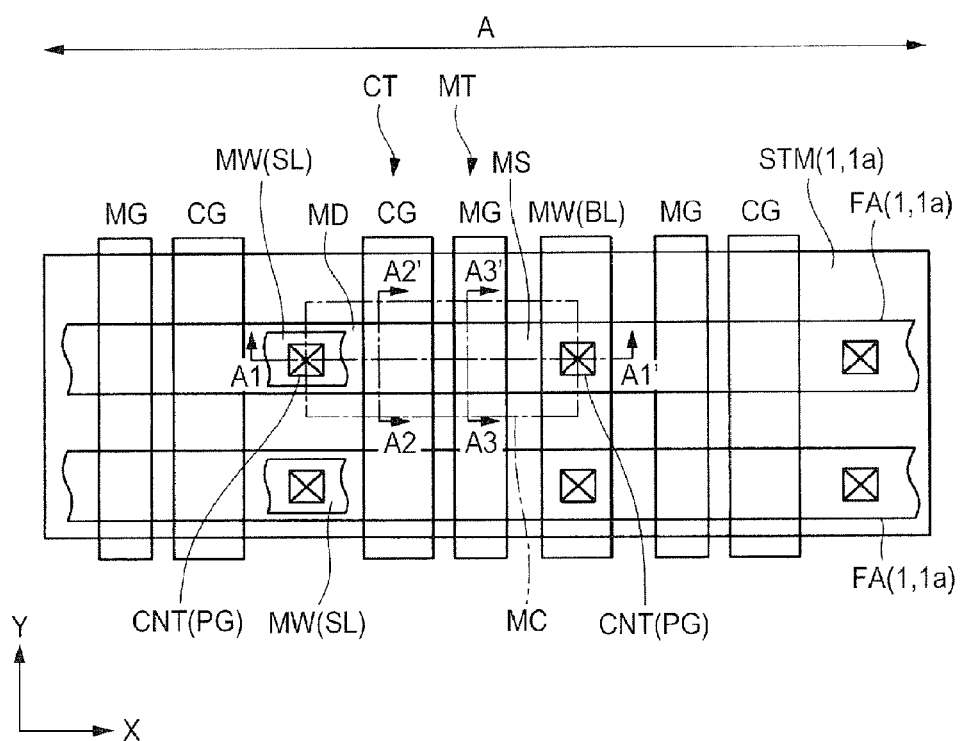
FIG. 1 is a plan view of an essential part of a semiconductor device that is an embodiment.

In the embodiments below, when it is required for the sake of convenience, although description will be made dividedly into plural sections or embodiments, they are not unrelated to each other, and one has a relationship of a modification, detail, supplementary explanation and the like of a part or entirety with the other with the exception of a case particularly stated explicitly. Further, in the embodiments below, when the quantity of elements and the like (including the number of pieces, numerical value, amount, range and the like) are mentioned, they are not limited to the specific quantity mentioned and may be equal to or more than and equal to or less than the specific quantity mentioned with the exception of a case particularly specified explicitly, a case apparently limited to a specific quantity in principle, and so on. Also, in the embodiments below, it is needless to mention that the constituent elements thereof (also including the elemental step and the like) are not necessarily indispensable with the exception of a case particularly specified explicitly, a case considered to be apparently indispensable in principle, and so on. In a similar manner, in the embodiments below, when the shape, the positional relation and the like of a constituent element and the like are mentioned, they are to contain one that is substantially approximate or similar to the shape and the like thereof and so on with the exception of a case particularly specified explicitly, a case apparently considered not to be the case in principle, and so on. This fact is also similar with respect to the numerical value and the range described above.

Below, the embodiment will be explained in detail based on the drawings. Also, in all drawings for explaining the embodiment, a same reference sign will be given to a member having a same function, and repeated explanation thereon will be omitted. Further, in the embodiments below, explanation on a same or similar portions will not be repeated in principle except when it is particularly required.

Also, in the drawings used in the embodiments, there is also a case hatching is omitted even in cross-sectional view in order to facilitate understanding of the drawing. Further, there is also a case hatching is given even in plan view in order to facilitate understanding of the drawing.

Embodiment

<Device Structure of Semiconductor Device>

Figure 2:
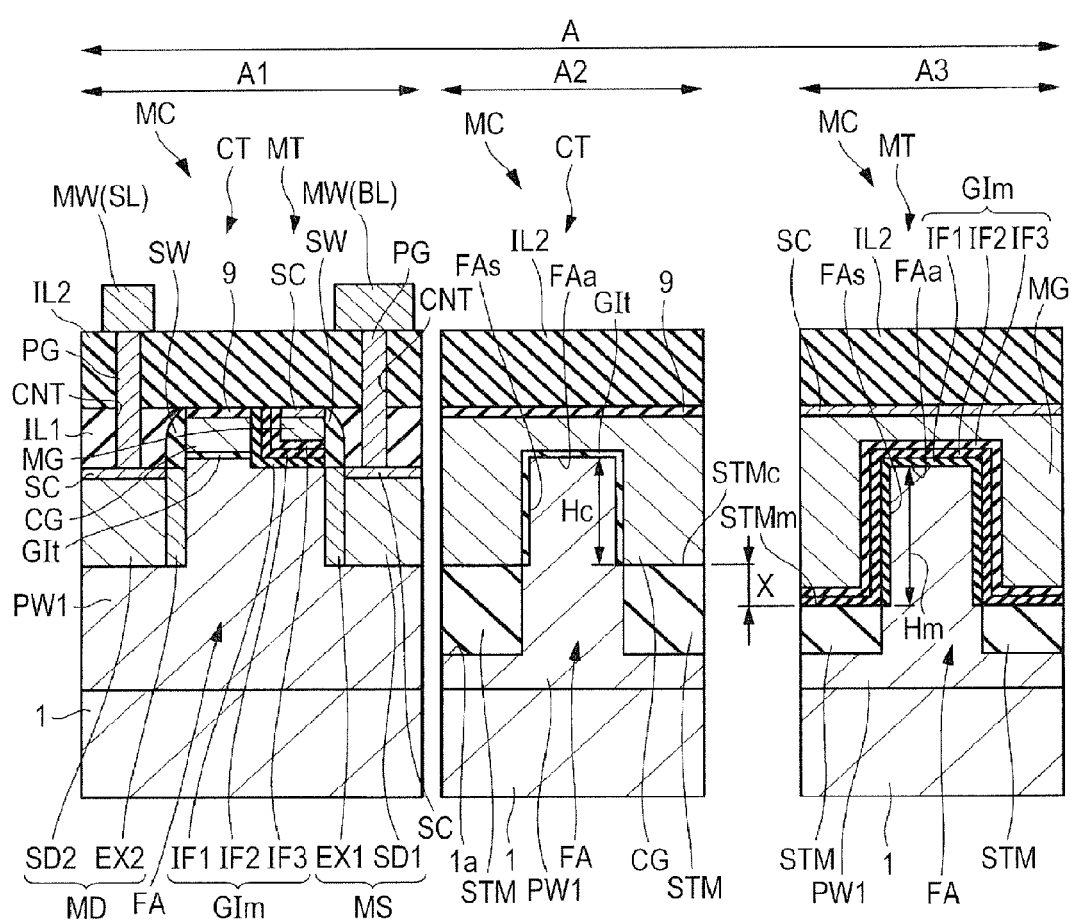
FIG. 2 is a cross-sectional view of an essential part of the semiconductor device that is an embodiment.

FIG. 1 is a plan view of an essential part of a semiconductor device in the present embodiment. As shown in FIG. 1, in a memory cell section A, plural memory cells are disposed in a matrix shape, and form a memory cell array. FIG. 2 is a cross-sectional view of an essential part of the semiconductor device in the present embodiment. In FIG. 2, three cross-sectional views of the memory cell section A are shown, a memory cell section A1 is a cross-sectional view along A1-A1' of FIG. 1, a memory cell section A2 is a cross-sectional view along A2-A2' of FIG. 1, and a memory cell section A3 is a cross-sectional view along A3-A3' of FIG. 1. In other words, the memory cell section A1 is a cross-sectional view along the extending direction of a fin FA, the memory cell section A2 is a cross-sectional view along the extending direction of a control gate electrode CG, and the memory cell section A3 is a cross-sectional view along the extending direction of a memory gate electrode MG.

As shown in FIG. 1, in the memory cell section A, plural fins FA extending in X direction are disposed at equal intervals in Y direction. The fin FA is a protruded section (projected section) of a rectangular parallelepiped selectively protruded from a main surface (surface, upper surface) 1a of a semiconductor substrate 1 for example, and the lower end portion of the fin FA is surrounded by an element separation film STM that covers the main surface 1a of the semiconductor substrate 1. The fin FA is a part of the semiconductor substrate 1, and is an active region of the semiconductor substrate 1. Therefore, in plan view, the gap between the adjacent fins FA is filled with the element separation film STM, and the periphery of the fin FA is surrounded by the element separation film STM. The fin FA is an active region for forming a memory cell MC. Although it is not illustrated, the fin FA terminates at the end of the memory cell array. In other words, the fin FA has its both ends in X-direction.

Over the plural fins FA, the plural control gate electrodes CG and the plural memory gate electrodes MG which extend in Y direction (the direction orthogonal to X direction) are disposed. So as to sandwich the control gate electrode CG and the memory gate electrode MG, a drain region MD is formed on the side of the control gate electrode CG, and a source region MS is formed on the side of the memory gate electrode MG. The drain region MD and the source region MS are semiconductor regions of n-type formed in the inside of the fin FA. The drain region MD is formed between the two control gate electrodes CG which are adjacent to each other in X direction, and the source region MS is formed between the two memory gate electrodes MG which are adjacent to each other in X direction. The memory cell MC includes the control gate electrodes CG, the memory gate electrode MG, the drain region MD, and the source region MS. The memory cell MC includes a control transistor CT that includes the control gate electrodes CG, and a memory transistor MT that is coupled with the control transistor CT and includes the memory gate electrode MG. The memory cell MC is a sprit gate type cell (a sprit gate type memory cell).

In the two memory cells MC which are adjacent to each other in X direction, the drain region MD or the source region MS is shared. The two memory cells MC which share the drain region MD are mirror-symmetric to each other in X direction with respect to the drain region MD, and the two memory cells MC which share the source region MS are mirror-symmetric to each other in X direction with respect to the source region MS.

In each fin FA, the plural memory cells MC are formed in X direction, the drain region MD of the plural memory cells MC arrayed in X direction is coupled with a source line SL formed of a metal wire MW extending in X-direction through a plug electrode PG which is formed inside a contact hole CNT. Also, the source region MS of the plural memory cells MC arrayed in Y direction is coupled with a bit line BL formed of a metal wire MW extending in Y-direction. It is preferable that a metal wire of a layer different from the bit line BL is used for the source line SL.

The fin FA is a protruded section of a rectangular parallelepiped for example which protrudes from the main surface 1a of the semiconductor substrate 1 in a direction orthogonal to the main surface 1a. The fin FA has an optional length in the long side direction, an optional width in the short side direction, and an optional height in the height direction. The fin FA is not necessarily a rectangular parallelepiped, and includes a shape obtained by rounding the corner parts of the rectangle in cross-sectional view in the short side direction. Also, the direction along which the fin FA extends in plan view is the long side direction, and the direction orthogonal to the long side direction is the short side direction. In short, the length is larger than the width. The shape of the fin FA is not a question as far as it is a protruded section having a length, width, and height. In the width direction, the fin FA has opposing side surfaces, and a main surface (upper surface) that couples the opposing side surfaces. For example, a meandering pattern in plan view is also included.

Next, the structure of the memory cell MC will be explained using FIG. 2.

In the memory cell section A of the semiconductor substrate 1, the fin FA is formed which is the protruded section of the semiconductor substrate 1. The lower part of the fin FA is surrounded by the element separation film STM which is formed over the main surface 1a of the semiconductor substrate 1. In other words, as shown in FIG. 1, the fins FA are separated by the element separation film STM. In the lower part of the fin FA, a p-type well PW1 is formed which is a semiconductor region of p-type. In other words, the fin FA is formed inside the p-type well PW1. The plural fins FA are formed inside the p-type well PW1 although they are not illustrated.

The control gate electrode CG is formed over a main surface FAa and side surfaces FAs of the fin FA through a gate insulating film GIt, and the memory gate electrode MG is formed in a region adjacent to the control gate electrode CG in the long side direction of the fin FA through a gate insulating film GIm. The control gate electrode CG and the memory gate electrode MG are electrically separated from each other by the gate insulating film GIm. An insulating film different from the gate insulating film GIm may be imposed between the control gate electrode CG and the memory gate electrode MG for electrical separation.

Here, the gate insulating film GIt is a thermal oxidation film (silicon oxide film) formed by thermal oxidation of the main surface FAa and the side surfaces FAs of the fin FA which is the protruded section of the semiconductor substrate 1 formed of silicon, and the film thickness thereof is 2 nm. Also, the gate insulating film GIm is comprised of an insulating film IF1 which is formed of a thermal oxidation film (silicon oxide film) formed by thermal oxidation of the main surface FAa and the side surfaces FAs of the fin FA which is the protruded section of the semiconductor substrate 1 formed of silicon and having the film thickness of 4 nm, an insulating film IF2 formed over the insulating film IF1, and an insulating film IF3 formed over the insulating film IF2. The insulating film IF2 is formed of a silicon nitride film which is an electric charge accumulation layer (electric charge accumulation section, electric charge accumulation region), and the insulating film IF3 is formed of a silicon oxynitride film which covers the surface of the silicon nitride film. The silicon nitride film has the film thickness of 7 nm, and the silicon oxynitride film has the film thickness of 9 nm. In other words, the gate insulating film GIm has a laminated structure of the silicon oxide film, the silicon nitride film, and the silicon oxynitride film, and the film thickness thereof becomes 20 nm which is thicker than the gate insulating film GIt below the control gate electrode CG. The gate insulating film GIm may be a silicon oxide film, a silicon nitride film, a silicon oxynitride film, and a laminated structure thereof. Also, as the gate insulating film GIm, a laminated film may be used which combines a silicon oxide film (SiOx), a silicon nitride film (SiN), an aluminum oxide film (AlOx), a hafnium oxide film (HfOx), and a silicon oxynitride film (SiON). For example, the gate insulating film GIm may have a laminated structure of SiOx/SiON/HfOx/AlOx, AlOx/SiON/HfOx/AlOx, or SiON/SiOx/HfOx/AlOx, and so on from the semiconductor substrate 1 side.

As shown in the memory cell section A2, in the short side direction of the fin FA, the control gate electrode CG extends along the main surface FAa and the opposing side surfaces FAs of the fin FA through the gate insulating film GIt, and extends over the element separation film STM which surrounds (sandwiches) the lower part of the fin FA. In a similar manner, as shown in the memory cell section A3, in the short side direction of the fin FA, the memory gate electrode MG extends along the main surface FAa and the opposing side surfaces FAs of the fin FA through the gate insulating film GIm, and extends over the element separation film STM which surrounds (sandwiches) the fin FA. In the extending direction of the memory gate electrode MG, between the element separation film STM and the memory gate electrode MG, the insulating film IF2 and the insulating film IF3 are interposed.

Although a silicide layer SC is formed over the main surface of the memory gate electrode MG, the main surface of the control gate electrode CG is covered with an insulating film 9, and a silicide layer is not formed. Also, a source region MS and a drain region MD are arranged outside the control gate electrode CG and the memory gate electrode MG so as to sandwich the control gate electrode CG and the memory gate electrode MG. The source region MS includes an n⁻-type semiconductor region EX1 and an n⁺-type semiconductor region SD1, and the drain region MD includes an n⁻-type semiconductor region EX2 and an n⁺-type semiconductor region SD2. In the short side direction and the height direction, the source region MS and the drain region MD are formed over the entire region of the fin FA exposed from the element separation film STM. Over the surface of the n⁺-type semiconductor regions SD1 and SD2 of the source region MS and the drain region MD also, the silicide layer SC is formed.

Over the side wall of the control gate electrode CG and the memory gate electrode MG, a side wall spacer (side wall, side wall insulating film) SW and an inter-layer insulating film IL1 are formed, and an inter-layer insulating film IL2 is formed over the inter-layer insulating film IL1 so as to cover the control gate electrodes CG, the memory gate electrode MG, the source region MS, and the drain region MD. The metal wirings MW are formed over the inter-layer insulating film IL2, and the metal wirings MW are coupled with the silicide layers SC of the source region MS and the drain region MD through the plug electrodes PG arranged inside the contact holes CNT which are formed in the inter-layer insulating films IL2 and IL1.

The memory cell MC includes the control gate electrodes CG, the memory gate electrode MG, the drain region MD, and the source region MS. Also, the distance between the drain region MD and the source region MS of the long side direction is equivalent to the channel length of the memory cell MC, and a region where the control gate electrode CG or the memory gate electrode MG opposes (overlaps with) the main surface FAa and the side surfaces FAs of the fin FA in the short side direction is equivalent to the channel width of the memory cell MC. Further, because the memory cell MC includes the control transistor CT and the memory transistor MT, the length of the control gate electrodes CG over the main surface FAa of the fin FA is equivalent to the gate length of the control transistor CT, and the region where the control gate electrodes CG opposes (overlaps with) the main surface FAa and the side surfaces FAs of the fin FA in the short side direction is equivalent to the channel width of the control transistor CT. Also, the length of the memory gate electrode MG over the main surface FAa of the fin FA is equivalent to the gate length of the memory transistor MT, and the region where the memory gate electrodes MG opposes (overlaps with) the main surface FAa and the side surfaces FAs of the fin FA in the short side direction is equivalent to the channel width of the memory transistor MT.

In the present embodiment, a main surface STMm of the element separation film STM of the memory cell section A3 is lower than a main surface STMc of the element separation film STM of the memory cell section A2. Therefore, even when the insulating films IF2, IF3 are interposed between the element separation film STM and the memory gate electrode MG, the height of the fin contributing to the ON-current of the memory transistor MT can be brought close to the height of the fin contributing to the ON-current of the control transistor CT. Accordingly, the ON-current of the memory transistor MT can be increased, and the reading characteristics and the writing characteristics can be improved. Here, the fact that the main surface STMm is lower than the main surface STMc means that the film thickness of the element separation film STM of a region (portion) overlapping with the memory gate electrode MG relative to the main surface 1a of the semiconductor substrate 1 is thinner than the film thickness of a region (portion) overlapping with the control gate electrode CG.

Further, it is preferable that the main surface STMm of the element separation film STM of the memory cell section A3 is made lower than the main surface STMc of the element separation film STM of the memory cell section A2 by a distance X, and that this distance X is made equal to or greater than a film thickness D of the gate insulating film GIm. The height of the fin contributing to the ON-current of the memory transistor MT can be made equal to or greater than the height of the fin contributing to the ON-current of the control transistor CT. Therefore, the ON-current of the memory transistor MT can be increased, and the reading characteristics and the writing characteristics can be improved. Here, the height of the fin contributing to the ON-current means a range where the memory gate electrode MG or the control gate electrode CG overlaps with the side wall FAs of the fin FA. Here, it is preferable that the main surfaces STMc and STMm of the element separation film STM are made portions where the element separation film STM and the fin FA contact each other for example. Further, the film thickness D of the gate insulating film GIm means the total film thickness of the insulating films IF1, IF2, and IF3, and it is preferable that the insulating film IF1 is made the film thickness over the main surface FAa or the side surface FAs of the fin FA, and that the insulating films IF2 and IF3 are made the film thickness over the main surface FAa of the fin FA or over the element separation film STM.

Also, because the main surface STMm of the element separation film STM of the memory cell section A3 is lowered than the main surface STMc of the element separation film STM of the memory cell section A2, a fin height Hm of the memory cell section A3 is higher (greater) than a fin height Hc of the memory cell section A2. Further, the difference of the fin height Hm of the memory cell section A3 and the fin height Hc of the memory cell section A2 becomes equal to or greater than the film thickness D of the gate insulating film GIm. Here, the fin height Hm is the distance from the main surface STMm of the element separation film STM of the memory cell section A3 to the main surface FAa of the fin FA, and the fin height Hc is the distance from the main surface STMc of the element separation film STM of the memory cell section A2 to the main surface FAa of the fin FA.

Also, because the main surface STMm of the element separation film STM of the memory cell section A3 is lowered than the main surface STMc of the element separation film STM of the memory cell section A2, the film thickness of the element separation film STM over the main surface 1a of the semiconductor substrate 1 below the memory gate electrode MG is thinner than that below the control gate electrode CG.

Further, the p-type wells PW1 and PW2 shown in FIG. 2 are omitted in FIG. 3-FIG. 17.

<Manufacturing Step of Semiconductor Device>

FIG. 3-FIG. 17 are cross-sectional views or plan views of an essential part during a forming step of the semiconductor device of the present embodiment.

First, the manufacturing step of the fin FA of the memory cell section A will be explained.

Figure 3:
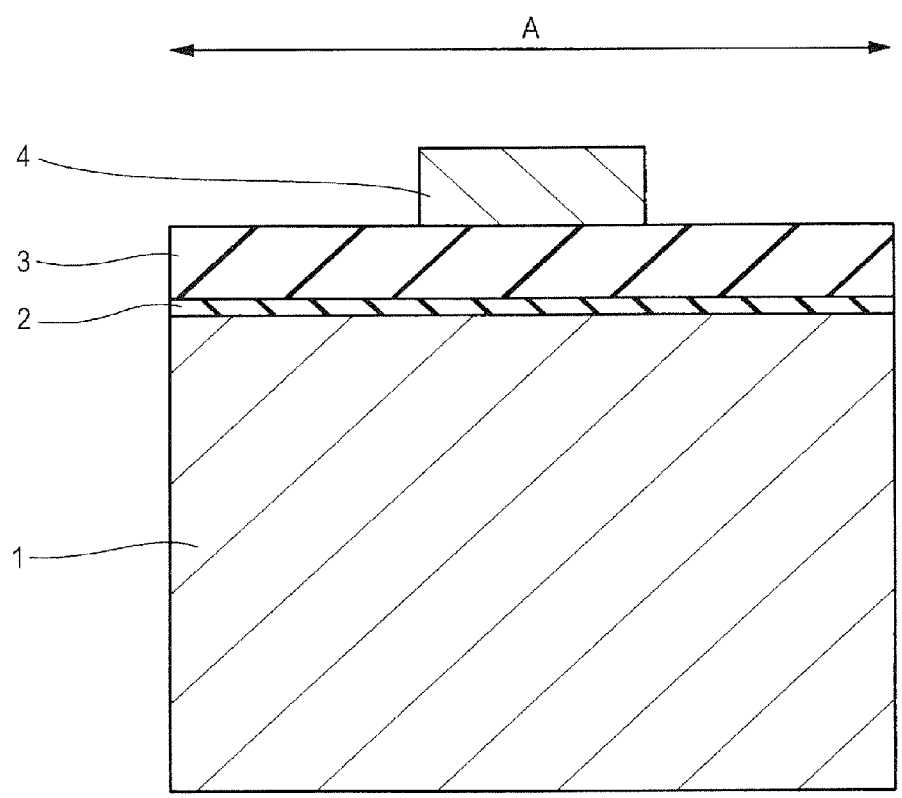
FIG. 3 is a cross-sectional view of an essential part during a manufacturing step of the semiconductor device that is an embodiment.

FIG. 3 is a drawing explaining a forming step (step S1) of a mask film 4 for determining the region for forming the fin FA.

Over the semiconductor substrate 1, insulating films 2 and 3 are stacked. The semiconductor substrate 1 is formed of a mono-crystalline silicon of p-type having the specific resistance of approximately 1-10 Ωcm, and so on for example. The insulating film 2 is formed of a silicon oxide film, and the film thickness thereof is approximately 2-10 nm. The insulating film 3 is formed of a silicon oxynitride film, and the film thickness thereof is approximately 20-100 nm. Next, an amorphous silicon film is stacked over the insulating film 3 and is thereafter patterned into a desired shape, and thereby the mask film 4 formed of the amorphous silicon film is formed. The film thickness of the mask film 4 is made 20-200 nm. Because the fin FA or FB is formed at both ends of the mask film 4, the interval of the neighboring fins FA can be determined by the width of the mask film 4.

Figure 4:
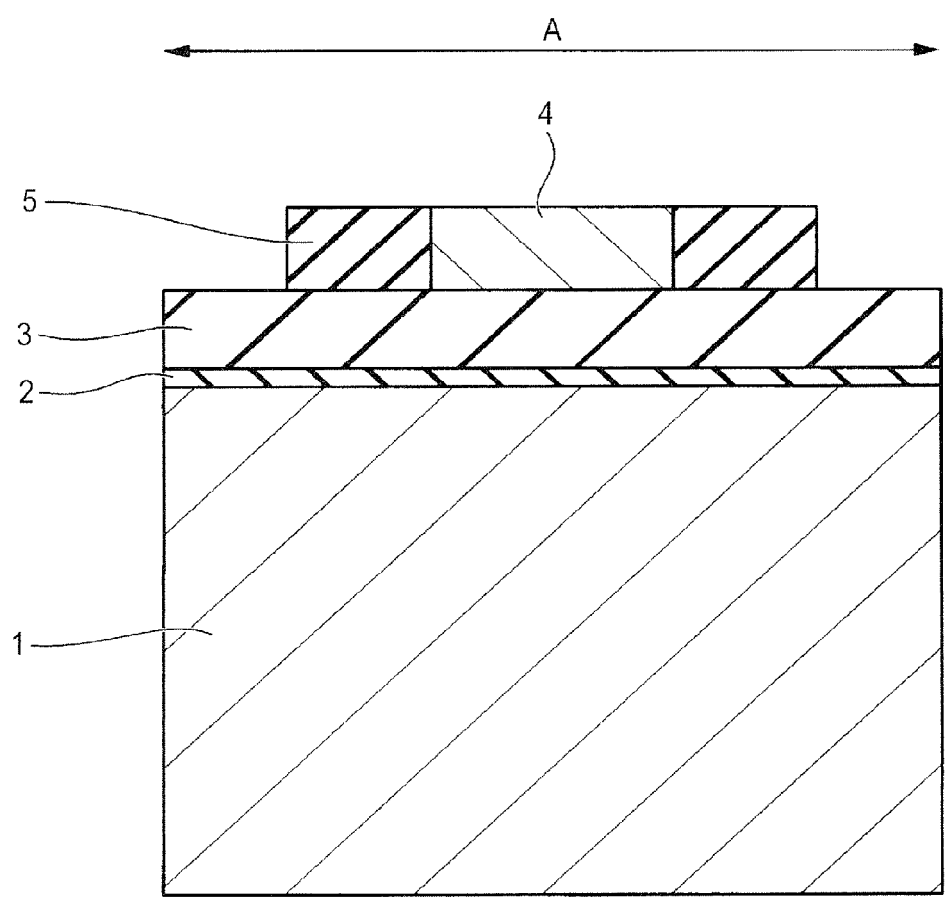
FIG. 4 is a cross-sectional view of an essential part during a manufacturing step of the semiconductor device subsequent to FIG. 3.

FIG. 4 is a drawing explaining a forming step (step S2) of a hard mask film 5 for forming the fin FA.

After a silicon oxide film having the film thickness of 10-40 nm is stacked over the semiconductor substrate 1 so as to cover the upper surface and the side surfaces of the mask film 4, the silicon oxide film is subjected to anisotropic dry etching, and thereby the hard mask film 5 is formed over the side walls of the mask film 4. The width of the hard mask film 5 becomes 10-40 nm. After forming the hard mask film 5, the mask film 4 is removed.

Figure 5:
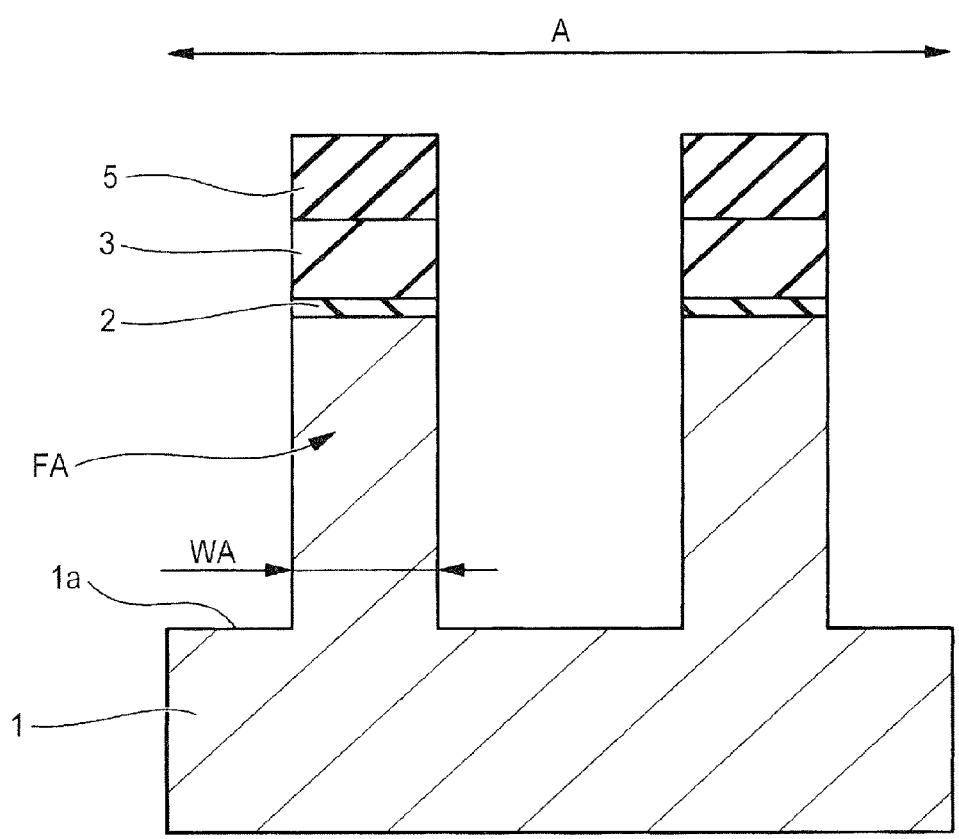
FIG. 5 is a cross-sectional view of an essential part during a manufacturing step of the semiconductor device subsequent to FIG. 4.

FIG. 5 is a drawing for explaining a forming step (step S3) of the fin FA.

The insulating films 3 and 2 as well as the semiconductor substrate 1 are subjected to anisotropic dry etching using the hard mask film 5 as a mask, and the insulating films 3 and 2 as well as the fin FA are formed which have a shape equal to that of the hard mask film 5 in plan view. Also, by cutting down the semiconductor substrate 1 of a region exposed from the hard mask film 5 by 100-250 nm, the fin FA having the height of 100-250 nm from the main surface 1a of the semiconductor substrate 1 can be formed. It is a matter of course that a width WA of the fin FA of the memory cell section A is equal to a width WB of the fin FB of a logic section B. Here, the width of the fin FA is the length in the direction the control gate electrode CG described above crosses. After forming the fin FA, the hard mask film 5 is removed.

Next, a forming step (step S4) of the element separation film STM will be explained.

Figure 6:
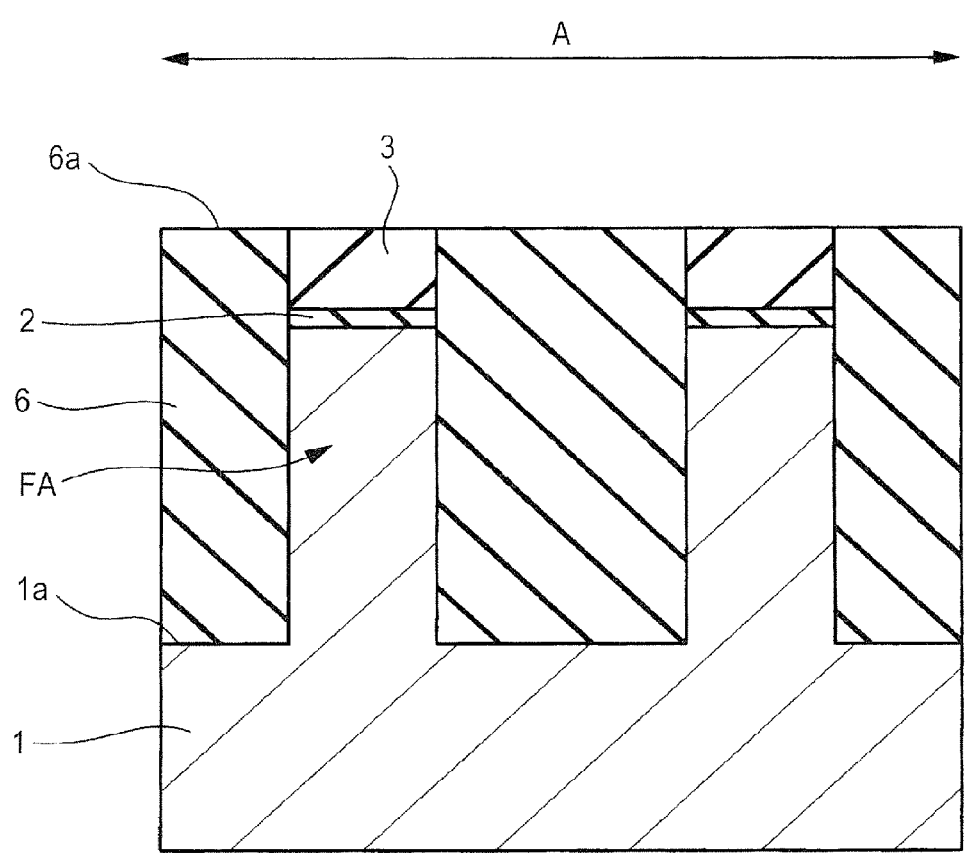
FIG. 6 is a cross-sectional view of an essential part during a manufacturing step of the semiconductor device subsequent to FIG. 5.

Over the semiconductor substrate 1, an insulating film formed of a silicon oxide film and the like is stacked so as to entirely embed the fin FA and the insulating films 2 and 3, this insulating film is subjected to CMP (Chemical Mechanical Polishing) treatment, and the main surface of the insulating film 3 is exposed. Thus, as shown in FIG. 6, an insulating film 6 having a flat main surface 6a is formed over the main surface 1a of the semiconductor substrate 1. After forming the insulating film 6, the insulating films 3 and 2 are removed. It is also possible to remove the insulating film 3 only.

Figure 7:
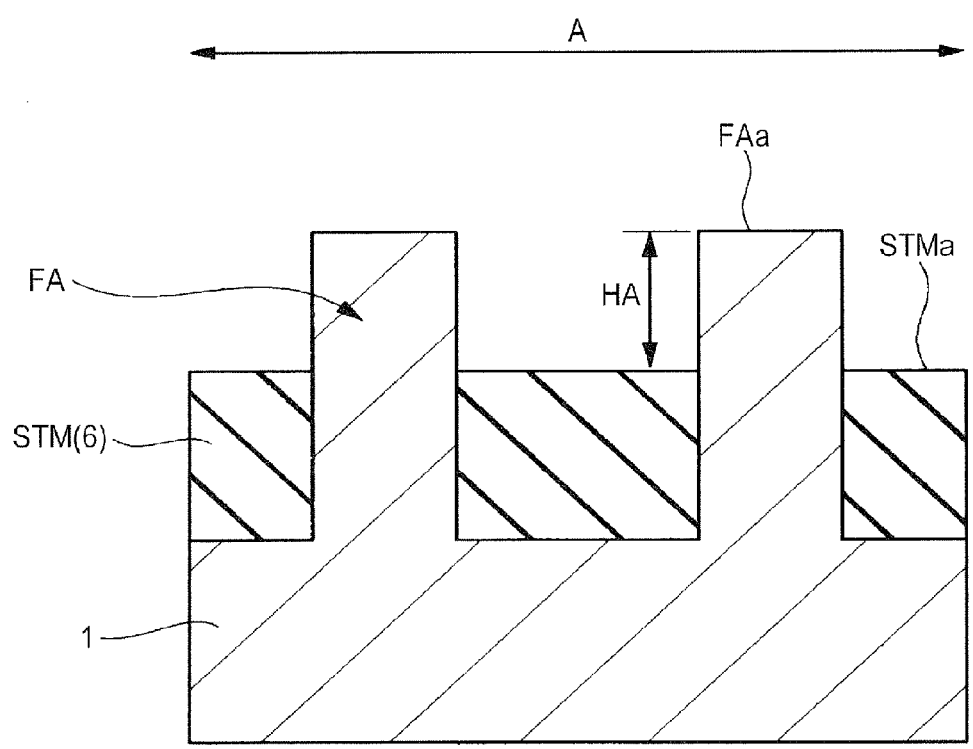
FIG. 7 is a cross-sectional view of an essential part during a manufacturing step of the semiconductor device subsequent to FIG. 6.

Next, as shown in FIG. 7, the insulating film 6 is subjected to etching treatment, the main surface 6a of the insulating film 6 is retracted (lowered) in the height direction, and a part of the side surfaces and the main surface of the fin FA are exposed. Thus, the element separation film STM is formed in the lower part of the fin FA of the memory cell section A. A height HA of the fin FA of the memory cell section A is the distance from a main surface (upper surface, surface) STMa of the element separation film STM to the main surface FAa of the fin FA. Thus, the forming step (step S4) of the element separation film STM is completed.

Next, in FIG. 8-FIG. 17, manufacturing of the memory cell MC will be explained. In FIG. 8-FIG. 17, the memory cell sections A1, A2, and A3 are shown similarly to FIG. 2.

Figure 8:
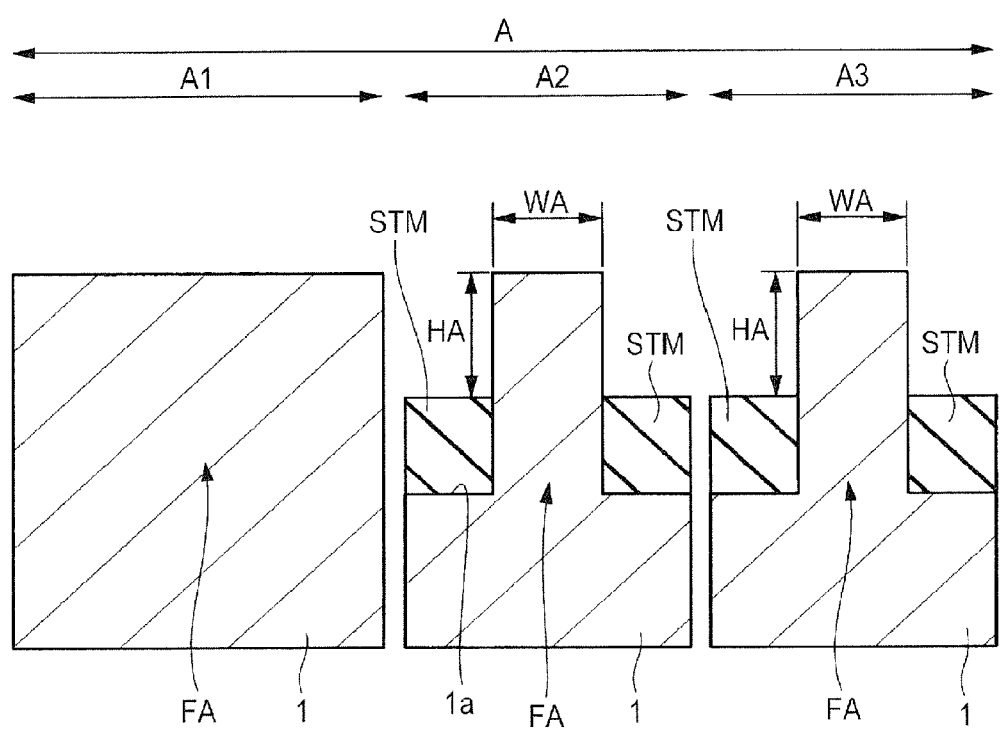
FIG. 8 is a cross-sectional view of an essential part during a manufacturing step of the semiconductor device in the same step of FIG. 7.

As shown in FIG. 8, in the memory cell sections A1, A2, and A3, the fin FA is provided. In the memory cell sections A2 and A3, the initial width WA of the fin FA and the initial height HA of the fin FA are approximately 40 nm equally. Also, the forming step of the p-type well PW1 shown in FIG. 2 is executed after the forming step (step 4) of the element separation film STM shown in FIG. 7 and before the step 5 described below.

Figure 9:
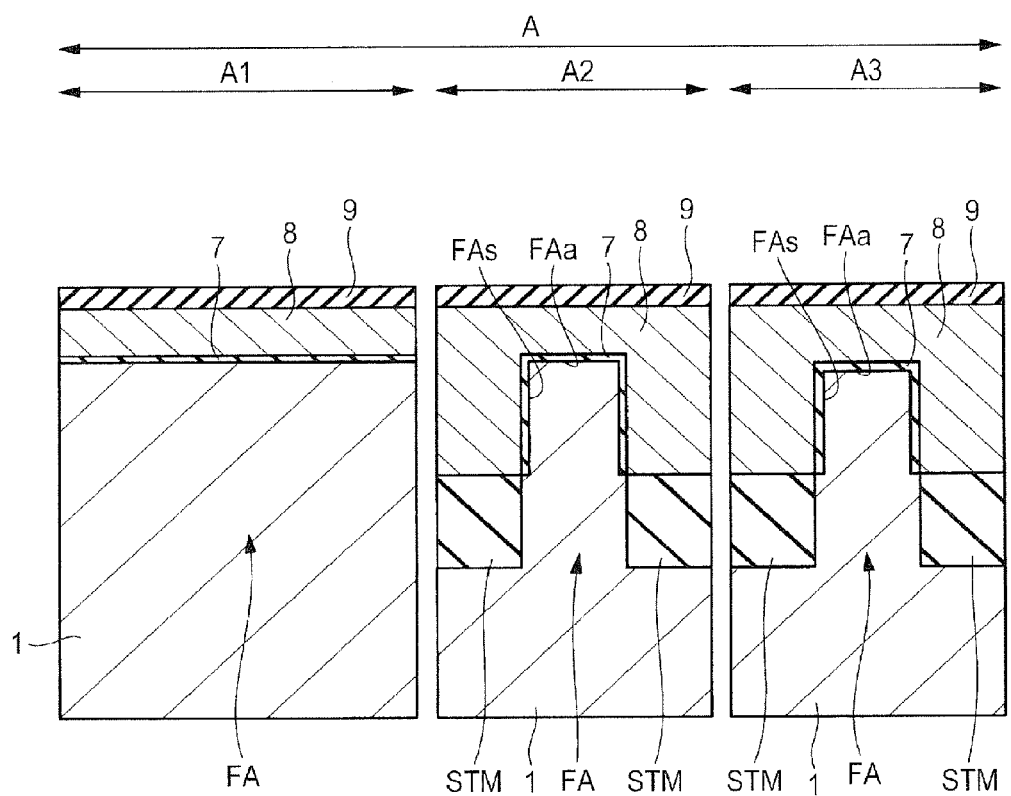
FIG. 9 is a cross-sectional view of an essential part during a manufacturing step of the semiconductor device subsequent to FIG. 8.

FIG. 9 shows a forming step (step S5) of an insulating film 7, a conductor film 8, and the insulating film 9. First, the insulating film 7 is formed over the main surface FAa and the side surfaces FAs of the fin FA. With respect to the insulating film 7, the main surface FAa and the side surfaces FAs of the fin FA are thermally oxidized, and a silicon oxide film of approximately 2 nm is formed. Next, the conductor film 8 having the film thickness equal to or greater than the height of the fin FA is stacked over the insulating film 7, the conductor film 8 is subjected to CMP treatment, and thereby the conductor film 8 having a flat main surface is formed.

Then, the insulating film 9 is stacked over the main surface of the conductor film 8. The conductor film 8 is formed of a polysilicon film (silicon film), and the insulating film 9 is formed of a silicon nitride film. Also, In the CMP step of the conductor film 8, it is important that the conductor film 8 remains over the main surface of the fin FA.

Figure 10:
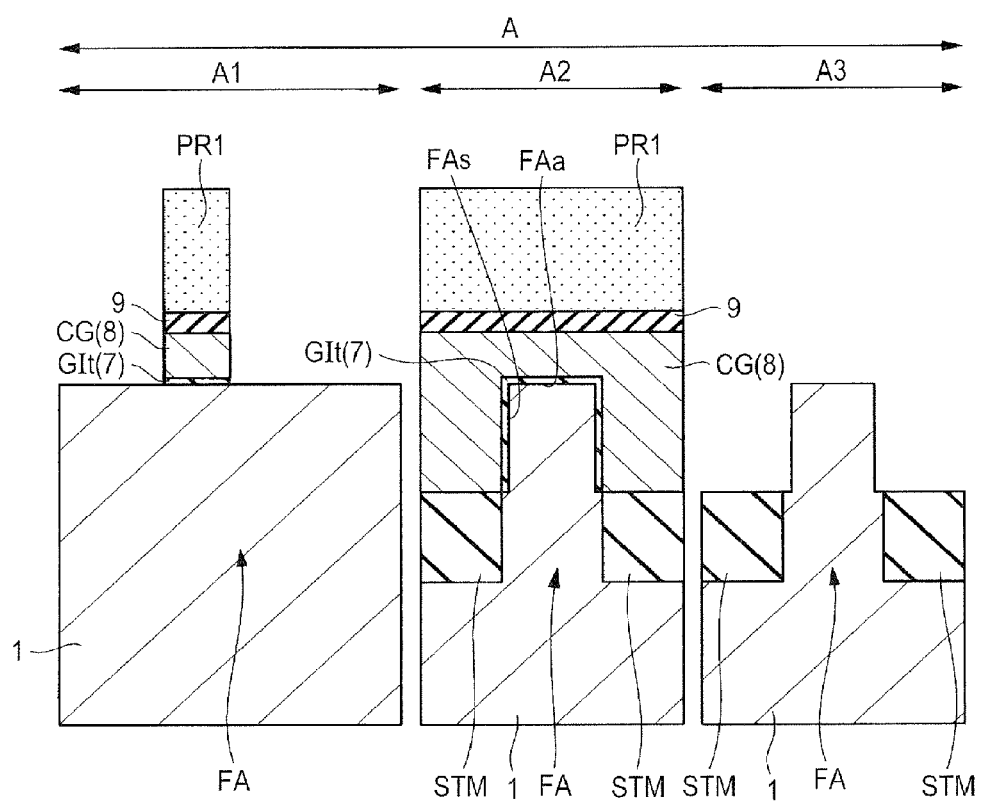
FIG. 10 is a cross-sectional view of an essential part during a manufacturing step of the semiconductor device subsequent to FIG. 9.

FIG. 10 shows a forming step (step S6) of the control gate electrode CG. Over the insulating film 9, a mask film formed of a resist film PR1 is selectively formed. The resist film PR1 has a pattern of covering the forming region of the control gate electrode CG and exposing the region other than that in the memory cell section A. The insulating film 9 and the conductor film 8 are subjected to dry etching treatment, the insulating film 9 and the conductor film 8 of the region exposed from the resist film PR1 are removed, and thereby the control gate electrode CG is formed. The insulating film 7 is worked in the dry etching treatment or the cleaning step thereafter, and thereby the gate insulating film GIt is formed below the control gate electrode CG. Also, in the memory cell section A3, the insulating film 9, the conductor film 8, and the insulating film 7 are removed, and the main surface FAa and the side surfaces FAs of the fin FA are exposed. Further, the resist film PR1 is removed after patterning the insulating film 9, or after patterning the insulating film 9 and the conductor film 8.

Figure 11:
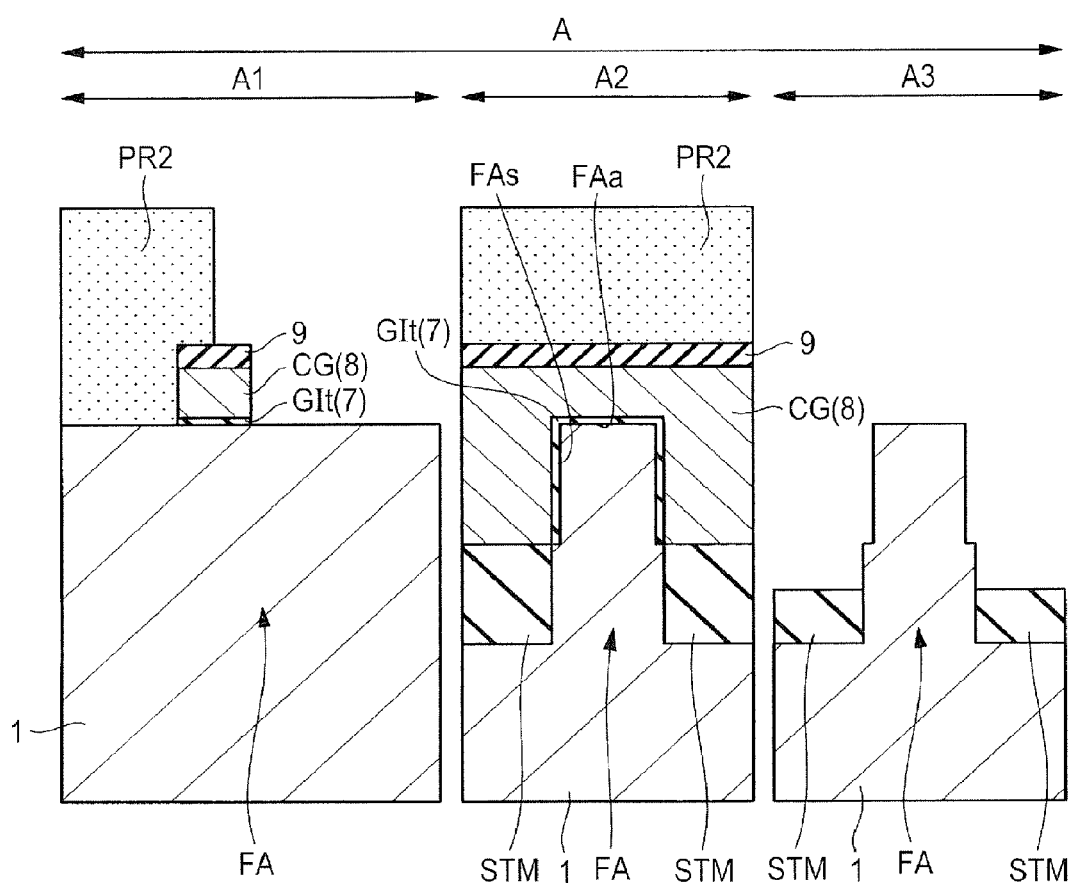
FIG. 11 is a cross-sectional view of an essential part during a manufacturing step of the semiconductor device subsequent to FIG. 10.
Figure 12:
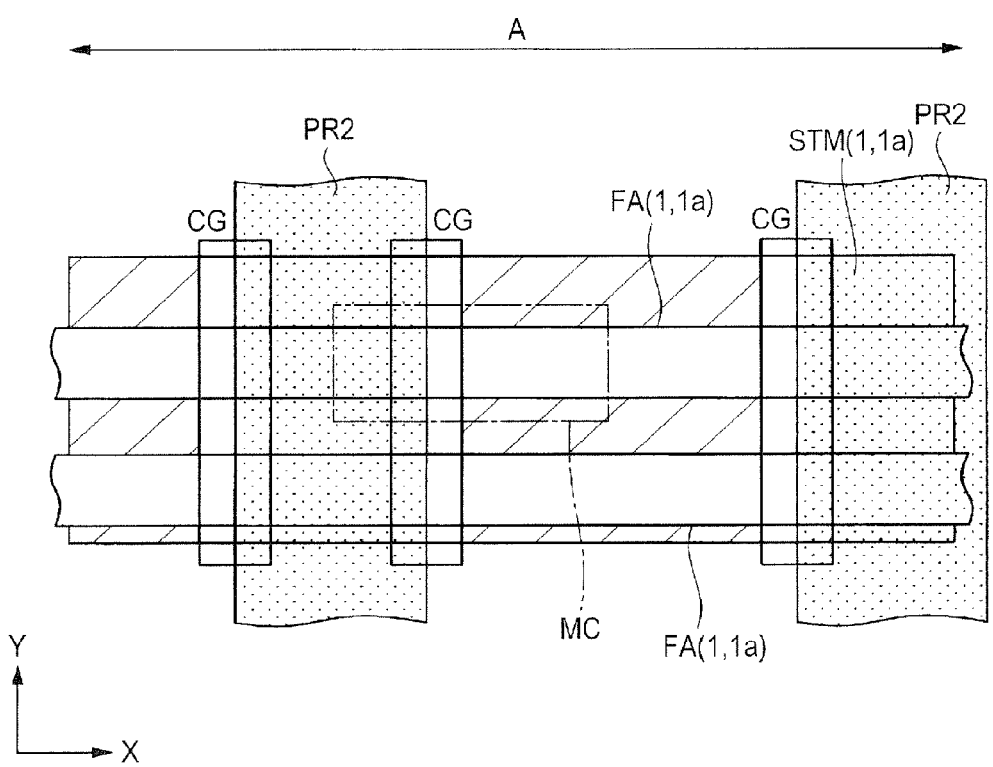
FIG. 12 is a cross-sectional view of an essential part during a manufacturing step of the semiconductor device subsequent to FIG. 11.

FIG. 11 and FIG. 12 show a retracting step (step S7) of the element separation film STM. As shown in FIG. 11 and FIG. 12, a region sandwiched by adjacent control gate electrodes CG is covered with a mask film formed of a resist film PR2. However, the region described above sandwiched by the adjacent control gates CG where the memory gate electrode MG is scheduled to be formed is exposed from the resist film PR2. Also, the element separation film STM exposed from the resist film PR2 is etched using the resist film PR2 as an etching mask, and the main surface STMa thereof is retracted (lowered) to the inward direction of the semiconductor substrate 1. In FIG. 12, hatching is given to the region retracting by etching. In other words, the element separation films STM of the region exposed from the resist film PR2, between the adjacent fins FA, and between the adjacent control gate electrodes CG retract. For this etching, it is preferable to use wet etching by hydrofluoric acid (HF) or buffered hydrofluoric acid (BHF) for example, and scraping of the head part of the fin FA can be reduced. Also, in wet etching, it is preferable to use a laminated film of a BARC film and a resist film as a mask film. Because the adhesion property of the BARC film and the element separation film STM of the bedding is high, the etching failure caused by peeling off of the mask film or bleeding out of the wet etching solution can be prevented. Further, for etching, dry etching using a fluorine-based gas may be used. Here, it is important to retract the surface of the STM of a portion where the memory gate electrode MG is formed. Also, it is suitable that the retracting amount of the element separation film STM is made equal to or greater than the total film thickness of the gate insulating film GIm.

Figure 13:
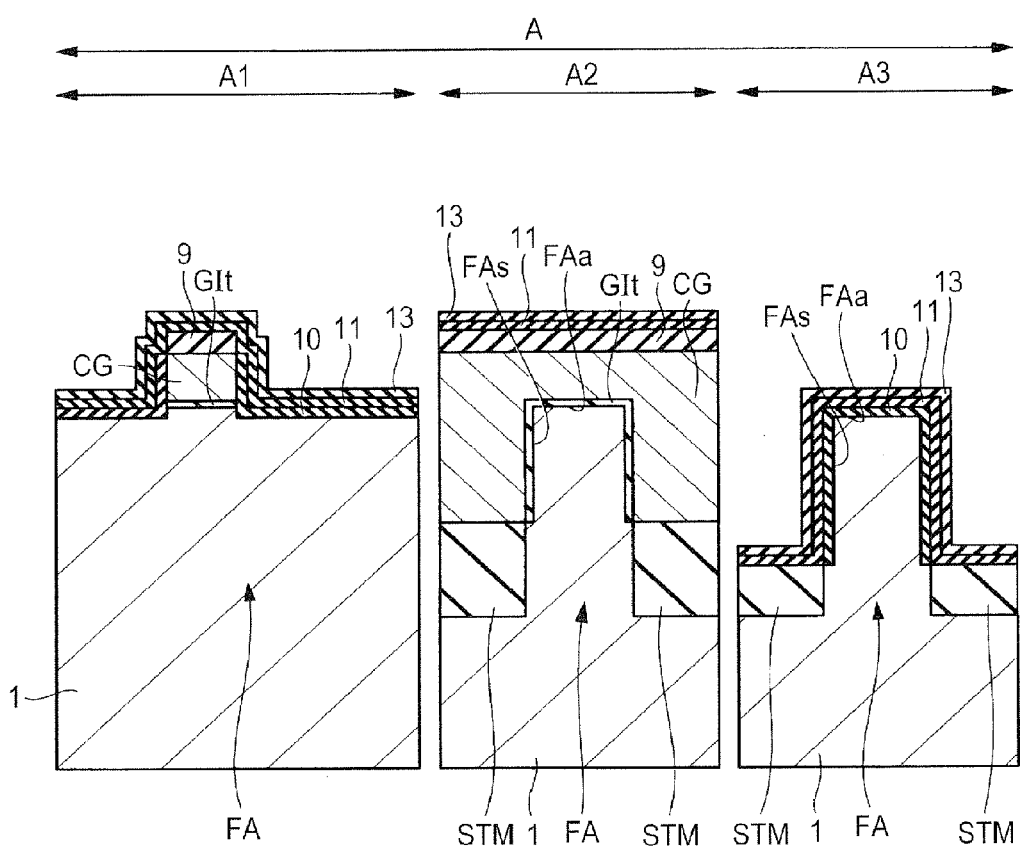
FIG. 13 is a cross-sectional view of an essential part during a manufacturing step of the semiconductor device subsequent to FIG. 11.

FIG. 13 shows a forming step (step S8) of insulating films 10, 11, and 13. First, over the main surface FAa and the side surfaces FAs of the fin FA exposed from the control gate electrode CG, the insulating films 10, 11, and 13 are formed sequentially. The insulating film 10 is a silicon oxide film formed by thermal oxidation of the main surface FAa and the side surfaces FAs of the fin FA, and the film thickness thereof is 4 nm which is thicker than the film thickness of the gate insulating film GIt. Next, the insulating film 11 is formed of a silicon nitride film formed by the CVD method, and the film thickness thereof is made 7 nm. Here, the side surfaces of the control gate electrode CG and the gate insulating film GIt are covered with the insulating film 11. Next, over the insulating film 11, the insulating film 13 is formed by the CVD method or thermal oxidation. The insulating film 13 is formed of a silicon nitride film formed for example, and the film thickness thereof is made 9 nm. Also, when the insulating film 13 is formed by oxidation of the surface of the insulating film 11 which is formed of a silicon nitride film, it is necessary to stack the insulating film 11 by approximately 16 nm for example considering also a portion of the film thickness of the insulating film 13.

Figure 14:
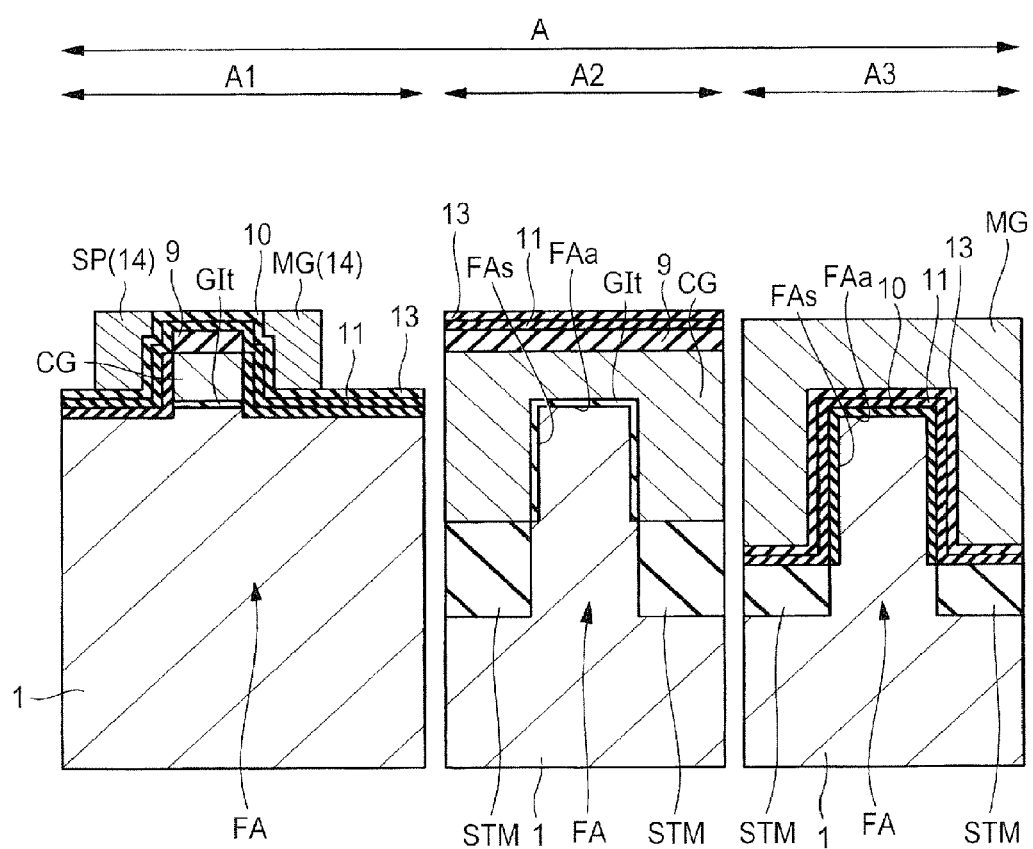
FIG. 14 is a cross-sectional view of an essential part during a manufacturing step of the semiconductor device subsequent to FIG. 13.

FIG. 14 shows a step of a part of a forming step (step S9) of the memory gate electrode MG. Over the insulating film 13, a conductor film 14 formed of a polysilicon film (silicon film) for example is stacked. With respect to the conductor film 14, the conductor film 14 having a film thickness equal to or greater than the height of the laminated body the control gate electrode CG and the insulating film 9 and the height of the fin FA of the memory cell section A3 is stacked. Next, by subjecting the conductor film 14 to anisotropic dry etching, the memory gate electrode MG and a spacer SP are formed over the side surfaces of the control gate electrode CG and the insulating film 9 through the insulating films 10, 11, and 13. Further, although the spacer SP has a structure similar to that of the memory gate electrode MG, because it is removed in the step described below, the name different from the memory gate electrode MG is given.

Figure 15:
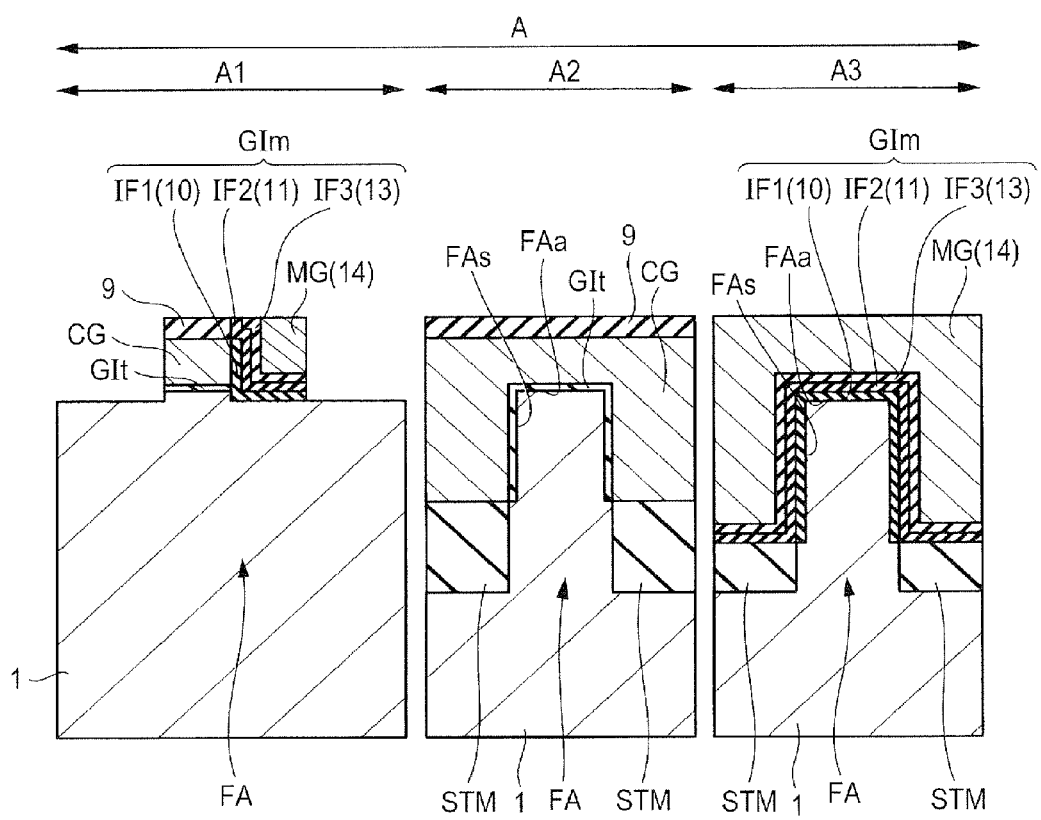
FIG. 15 is a cross-sectional view of an essential part during a manufacturing step of the semiconductor device subsequent to FIG. 14.

FIG. 15 shows a step (step S10) for removing the spacer SP and forming the gate insulating film GIm. First, the spacer SP shown in FIG. 14 is removed using a resist film (not illustrated) covering the memory gate electrode MG and exposing the spacer SP and by wet etching treatment for example. Next, the insulating films 13, 11 and 10 of the region exposed from the memory gate electrode MG are removed by wet etching treatment for example, the insulating films 13, 11 and 10 are made to remain selectively below the memory gate electrode MG (namely between the memory gate electrode MG and the fin FA), and the gate insulating film GIm comprised of the insulating films IF3, IF2 and IF1 is formed. As shown in FIG. 15, the gate insulating film GIm is formed along the main surface FAa and the side surfaces FAs of the fin FA. Further, the insulating films 11 and 13 out of the gate insulating film GIm are formed also between the element separation film STM and the memory gate electrode MG. Furthermore, the gate insulating film GIm is formed also not only between the main surface FAa of the fin FA and the memory gate electrode MG but also between the control gate electrode CG and the memory gate electrode MG.

Figure 16:
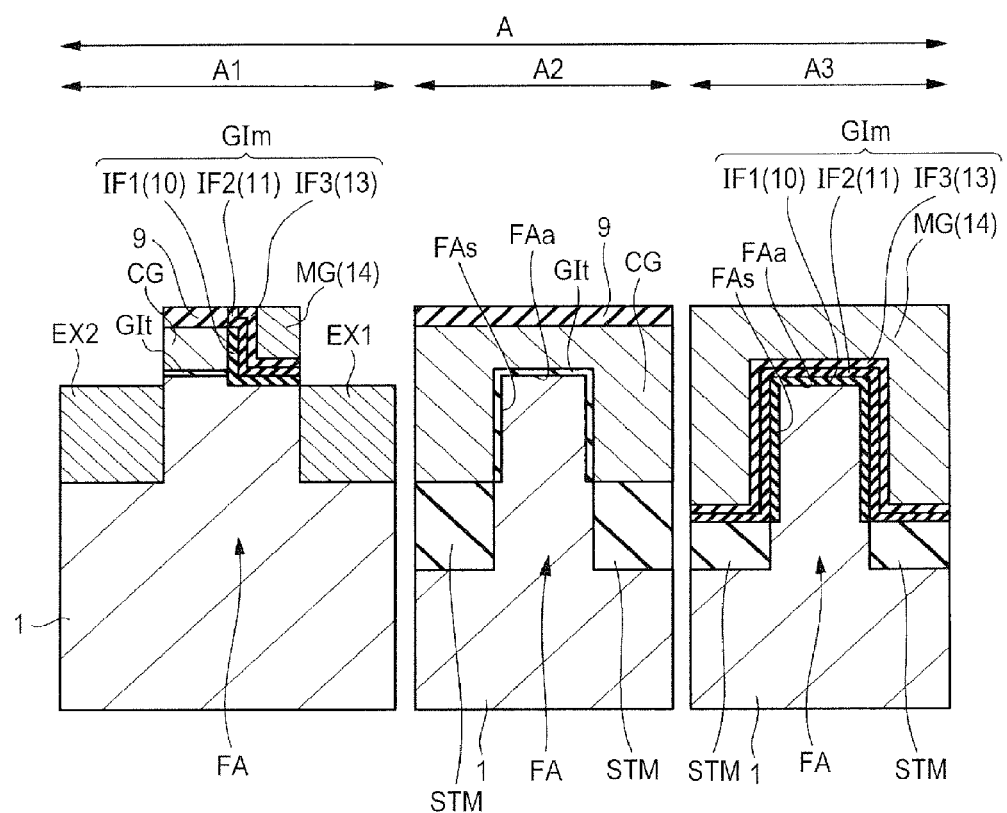
FIG. 16 is a cross-sectional view of an essential part during a manufacturing step of the semiconductor device subsequent to FIG. 15.

FIG. 16 shows a forming step (step S11) of the n⁻-type semiconductor regions (impurities diffusion layers) EX1, EX2. The n⁻-type semiconductor regions EX1 and EX2 are formed inside the fin FA by introducing n-type impurities such as arsenic (As) or phosphorus (P) for example into the fin FA by an ion injection method. The n⁻-type semiconductor regions EX1 and EX2 are formed in a self-aligning manner with respect to the control gate electrode CG and the memory gate electrode MG. In other words, because the n-type impurities are injected to the main surface and the side surfaces of the fin FA exposed from the control gate electrode CG and the memory gate electrode MG, the n⁻-type semiconductor regions EX1 and EX2 are formed on both sides of the control gate electrode CG and the memory gate electrode MG so as to sandwich the control gate electrode CG and the memory gate electrode MG. Because the impurities diffuse in the heat treatment after the ion injection, the n⁻-type semiconductor region EX1 overlaps with the memory gate electrode MG partly, and the n⁻-type semiconductor region EX2 overlaps with the control gate electrode CG partly.

Figure 17:
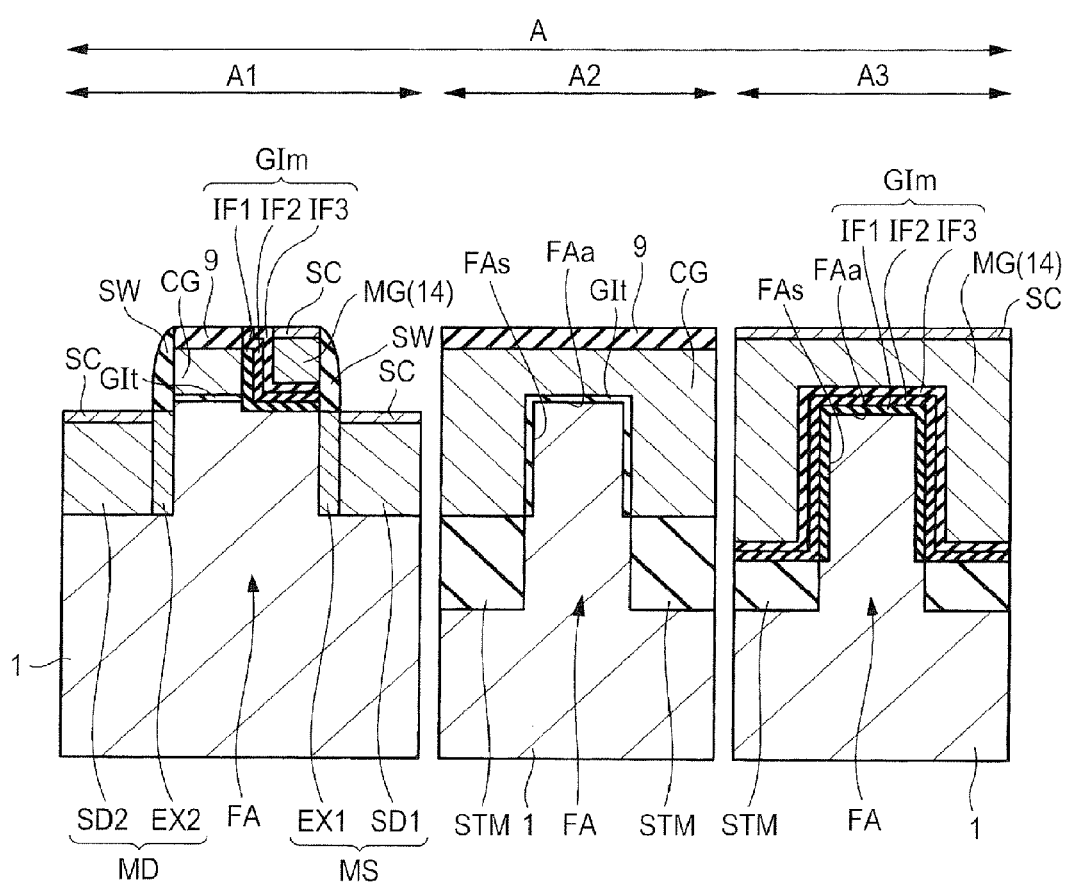
FIG. 17 is a cross-sectional view of an essential part during a manufacturing step of the semiconductor device subsequent to FIG. 16.

FIG. 17 shows a forming step (step S12) of the side wall spacer (side wall, side wall insulating film) SW, the n⁺-type semiconductor regions (impurities diffusion layers) SD1 and SD2, as well as the silicide layer SC. After an insulating film formed of a silicon oxide film, or a silicon nitride film, or a laminated film thereof for example is stacked over the semiconductor substrate 1 so as to cover the main surface FAa of the fin FA, the insulating film is subjected to anisotropic dry etching. Thus, in the memory cell region A1, side wall spacers SW are formed over the side walls of the control gate electrode CG and the insulating film 9, and over the side wall of the memory gate electrode MG. By the anisotropic dry etching described above, in the memory cell sections A2 and A3, the insulating films for forming the side wall spacers SW are removed, and the insulating film 9 or the memory gate electrode MG is exposed.

Next, by introducing n-type impurities such as arsenic (As) or phosphorus (P) for example into the fin FA by the ion injection method using the control gate electrode CG, the memory gate electrode MG, and the side wall spacer SW as a mask (a mask for preventing ion injection), the n⁺-type semiconductor regions SD1 and SD2 are formed.

Thus, an n-type semiconductor region functioning as the source region MS of the memory cell MC is formed by the n⁻-type semiconductor region EX1 and the n⁺-type semiconductor region SD1 having an impurities concentration higher than that of the n⁻-type semiconductor region EX1, and an n-type semiconductor region functioning as the drain region MD of the memory cell MC is formed by the n⁻-type semiconductor region EX2 and the n⁺-type semiconductor region SD2 having an impurities concentration higher than that of the n⁻-type semiconductor region EX2.

Next, the silicide layers SC are formed over the surfaces of the memory gate electrode MG, the source region MS, and the drain region MD. It is preferable that the silicide layer SC is formed of a cobalt silicide layer (when the metal film is a cobalt film), a nickel silicide layer (when the metal film is a nickel film), or a nickel silicide layer added with platinum (when the metal film is a nickel-platinum alloy film).

Steps thereafter will be explained referring to FIG. 2.

Next, a forming step (step S13) of the inter-layer insulating films IL1 and IL2, the plug electrode PG, and the metal wiring MW will be explained. First, the inter-layer insulating film IL1 is formed (stacked) over the semiconductor substrate 1. The inter-layer insulating film IL1 is comprised of a single body film of a silicon oxide film, or a laminated film of a silicon nitride film and a silicon oxide film that is formed over the silicon nitride film so as to be thicker than the silicon nitride film, and so on, and can be formed by the CMP method and the like for example. Next, the upper surface of the inter-layer insulating film IL1 is polished (polishing treatment) using the CMP method and the like, and respective upper surfaces of the control gate electrode CG and the memory gate electrode MG are exposed as shown in FIG. 2. In other words, in this polishing step, the insulating film 9 over the control gate electrode CG and the silicide layer SC over the memory gate electrode MG are exposed.

Next, the inter-layer insulating film IL2 is formed over the inter-layer insulating film IL1. With respect to the inter-layer insulating film IL2, a silicon oxide-based insulating film mainly formed of silicon oxide for example can be employed. The flatness of the upper surface of the inter-layer insulating film IL2 may be improved by polishing the upper surface of the inter-layer insulating film IL2 by the CMP method after forming the inter-layer insulating film IL2.

Next, the contact holes (openings, through holes) CNT are formed in the inter-layer insulating films IL1 and IL2. The silicide layers SC formed over the surfaces of the source region MS and the drain region MD of the memory cell MC are exposed from the contact holes CNT.

Next, inside the contact hole CNT, as an electro-conductive member for coupling, a plug electrode PG having electro-conductivity formed of tungsten (W) and the like is formed. The plug electrode PG has a laminated structure of a barrier conductor film (a titanium film, a titanium nitride film, or a laminated film of them for example) and a main conductor film (tungsten film) positioned over the barrier conductor film. The plug electrode PG is coupled with the source region MS and the drain region MD of the memory cell MC.

Next, the metal wiring MW is formed over the inter-layer insulating film IL2. The metal wiring MW has a laminated structure of a barrier conductor film (a titanium nitride film, a tantalum film, or a tantalum nitride film, and so on for example) and a main conductor film (copper film) formed over the barrier conductor film. In FIG. 2, in order to simplify the drawing, the metal wiring MW is shown integrating the barrier conductor film and the main conductor film. Further, the same applies to the plug electrode PG also.

By the steps described above, the semiconductor device of the present embodiment is completed.

According to the manufacturing method described above, there is a step of retracting the surface of the element separation film STM of a portion (region) where the memory gate electrode MG is formed before forming the gate insulating film GIm of the memory transistor MT. Therefore, after forming the gate insulating film GIm and the memory gate electrode MG, the height of a fin contributing to the ON-current of the memory transistor MT can be brought close to the height of a fin contributing to the ON-current of the control transistor CT.

Also, by making the retracting amount equal to or greater than the total film thickness of the gate insulating film GIm, the height of a fin contributing to the ON-current of the memory transistor MT can be made equal to or greater than the height of a fin contributing to the ON-current of the control transistor CT.

Although the invention achieved by the present inventors has been explained above specifically based on the embodiment, it is needless to mention that the present invention is not limited to the embodiment described above and various alterations are possible within a scope not deviating from the purposes thereof.

What is claimed is:

1. A method for manufacturing a semiconductor device, comprising the steps of:
   (a) providing a semiconductor substrate that includes a first main surface with the first main surface being covered with an element separation film, and a first projected section and a second projected section that protrude from the first main surface so as to penetrate the element separation film, extend in a first direction in plan view, and are adjacent to each other in a second direction that is orthogonal to the first direction;
   (b) forming a first insulating film over the first projected section and the second projected section;
   (c) forming, over the first insulating film, a first control gate electrode and a second control gate electrode that cross the first projected section and the second projected section, extend in the second direction, and are adjacent to each other in the first direction;

(d) selectively etching a second main surface of the element separation film of a region surrounded by the first projected section, the second projected section, the first control gate electrode, and the second control gate electrode in plan view, and forming a third main surface that is lower than the second main surface;

(e) forming a second insulating film over the first projected section, the second projected section, and the third main surface; and (f) forming, over the second insulating film, a memory gate electrode that crosses the first projected section and the second projected section, and extends in the second direction, wherein the memory gate electrode is formed between the first control gate electrode and the second control gate electrode, and extends over the third main surface.

2. The method for manufacturing the semiconductor device according to claim 1, wherein, in the step (a), relative to the first main surface, a height of the first projected section of a portion where the first control gate electrode crosses is equal to a height of the first projected section of a portion where the memory gate electrode crosses.

3. The method for manufacturing the semiconductor device according to claim 1, wherein, in the step (d), the third main surface is formed by etching the second main surface by equal to or greater than a portion of a film thickness of the second insulating film.

4. The method for manufacturing the semiconductor device according to claim 1, wherein, in the step (e), a silicon nitride film is formed by a CVD method as the second insulating film.

5. The method for manufacturing the semiconductor device according to claim 4, further comprising, between the step (e) and the step (f), the step of:

(g) forming a silicon oxynitride film over the surface of the second insulating film by oxidizing a surface of the second insulating film by a thermal oxidation method.

6. The method for manufacturing the semiconductor device according to claim 1, further comprising, between the step (d) and the step (e), the step of:

(h) forming a third insulating film formed of a thermal oxidation film in the first projected section and the second projected section.

7. The method for manufacturing the semiconductor device according to claim 6, further comprising between the step (e) and the step (f), the step of:

(i) forming a silicon oxide film over the second insulating film by a CVD method.

* * * * *